(12) United States Patent
Becken et al.

(10) Patent No.: US 9,150,450 B2
(45) Date of Patent: Oct. 6, 2015

(54) SYSTEM AND METHOD FOR FRIT SEALING GLASS PACKAGES

(75) Inventors: Keith James Becken, Bath, NY (US); Stephan Lvovich Logunov, Corning, NY (US); Robert Stephen Wagner, Corning, NY (US); Aiyu Zhang, Mason, OH (US); Lu Zhang, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 1919 days.

(21) Appl. No.: 11/992,369

(22) PCT Filed: Dec. 5, 2006

(86) PCT No.: PCT/US2006/046382
§ 371 (c)(1),
(2), (4) Date: Mar. 21, 2008

(87) PCT Pub. No.: WO2007/067533
PCT Pub. Date: Jun. 14, 2007

(65) Prior Publication Data
US 2010/0154476 A1    Jun. 24, 2010

Related U.S. Application Data

(60) Provisional application No. 60/748,131, filed on Dec. 6, 2005.

(51) Int. Cl.
*C03C 27/06* (2006.01)
*H01L 51/52* (2006.01)

(52) U.S. Cl.
CPC ............ *C03C 27/06* (2013.01); *H01L 51/5237* (2013.01)

(58) Field of Classification Search
USPC ..................................................... 65/36, 156
See application file for complete search history.

(56) References Cited

U.S. PATENT DOCUMENTS

| 4,029,932 | A | 6/1977 | Cook |
| 4,887,019 | A | 12/1989 | Reis et al. |
| 6,005,995 | A | 12/1999 | Chen et al. |
| 6,416,375 | B1 | 7/2002 | Cho et al. |
| 2003/0066311 | A1 | 4/2003 | Li et al. ............................ 65/43 |
| 2003/0156323 | A1 | 8/2003 | Overbeck |
| 2004/0207314 | A1 | 10/2004 | Aitken et al. |

FOREIGN PATENT DOCUMENTS

| JP | 11204040 | 12/1997 |
| JP | 2001102167 | 9/1999 |
| JP | 2003115266 | 9/1999 |
| JP | 2002182179 | 12/2000 |
| JP | 2002311439 | 4/2001 |
| JP | 2003332061 | 5/2003 |
| JP | 2005250454 | 1/2005 |
| WO | WO2006/045067 | 4/2006 ............ C03C 27/00 |

*Primary Examiner* — Matthew Daniels
*Assistant Examiner* — Cynthia Szewczyk
(74) *Attorney, Agent, or Firm* — Matthew J. Mason; Stephen Wentsler

(57) ABSTRACT

A sealing device and method are described herein that can be used to manufacture a hermetically sealed glass package. In one embodiment, the hermetically sealed glass package is suitable to protect thin film devices which are sensitive to the ambient environment (e.g., oxygen, moisture). Some examples of such glass packages are organic emitting light diode (OLED) displays, sensors, and other optical devices. The present invention is demonstrated using an OLED display as an example.

13 Claims, 7 Drawing Sheets

SYSTEM AND METHOD FOR FRIT SEALING GLASS PACKAGES

CLAIMING BENEFIT OF PRIOR FILED U.S. APPLICATION

This application claims the benefit of U.S. Provisional Application Ser. No. 60/748,131 filed on Dec. 6, 2005 and entitled "Method for Frit Sealing Glass Packages". The contents of this document are incorporated by reference herein.

TECHNICAL FIELD

The present invention relates to a method for hermetically sealing glass packages that are suitable to protect thin film devices which are sensitive to the ambient environment (e.g., oxygen, moisture). Some examples of such glass packages are organic emitting light diode (OLED) displays, sensors, and other optical devices. The present invention is demonstrated using an OLED display as an example.

BACKGROUND

OLEDs have been the subject of a considerable amount of research in recent years because of their use and potential use in a wide variety of electroluminescent devices. For instance, a single OLED can be used in a discrete light emitting device or an array of OLEDs can be used in lighting applications or flat-panel display applications (e.g., OLED displays). OLED displays are known to be very bright and to have a good color contrast and wide viewing angle. However, OLED displays and in particular the electrodes and organic layers located therein are susceptible to degradation resulting from interaction with oxygen and moisture which leak into the OLED display from the ambient environment. It is well known that the life of the OLED display can be significantly increased if the electrodes and organic layers located therein are hermetically sealed from the ambient environment. Unfortunately, it has been difficult to develop a sealing process to hermetically seal the OLED display. Some of the factors that can make it difficult for one to properly seal the OLED display are briefly mentioned below:

The hermetic seal should provide a barrier for oxygen ($10^{-3}$ cc/m$^2$/day) and water ($10^{-6}$ g/m$^2$/day).
  The size of the hermetic seal should be minimal (e.g., <2 mm) so it does not have an adverse effect on size of the OLED display.
  The temperature generated during the sealing process should not damage the materials (e.g., electrodes and organic layers) within the OLED display. For instance, the first pixels of OLEDs which are located about 1-2 mm from the seal in the OLED display should not be heated to more than 100° C. during the sealing process.
  The gases released during sealing process should not contaminate the materials within the OLED display.
  The hermetic seal should enable electrical connections (e.g., thin-film chromium electrodes) to enter the OLED display.

Today one way to seal the OLED display is to form a hermetic seal by heating and softening a frit that is doped with a material which is highly absorbent at a specific wavelength of light. In particular, a high power laser is used to heat-up and soften the frit to form a hermetic seal between a first substrate plate (cover glass) which has the frit located thereon and a second substrate plate (substrate glass) which has the OLEDs located thereon. The frit is typically ~1 mm wide and ~6-100 um thick. If the absorption and thickness of the frit is uniform, then the sealing can be done at a constant laser energy and a constant speed which causes a uniform temperature rise within the frit. However, when the frit is relatively thin, then 100% of the laser energy is not absorbed by the frit and instead some of the laser energy is absorbed or reflected by metal electrodes which cross the frit at certain points and are attached to the OLEDs. Since, it is often desirable to use thin frits and the metal electrodes often have different reflectivity and absorption properties as well as different thermal conductivities than the bare substrate glass, this can create an uneven temperature distribution within the frit during the sealing process. The uneven temperature distribution within the frit can lead to problematical cracks, residual stress and/or delamination which prevents/degrades a hermetic connection between the cover glass and the substrate glass.

To address this sealing problem, the assignee of the present invention has developed several different sealing techniques which have been disclosed in U.S. patent application Ser. No. 11/095,144 filed on Mar. 30, 2005 and entitled "Method for Backside Sealing Organic Light Emitting Diode (OLED) Displays" (the contents of this document are incorporated herein by reference). Although these sealing techniques work well there is still a desire to develop new and improved sealing techniques which can be used to hermetically seal an OLED display (or glass package). This particular need and other needs have been satisfied by the sealing device and the sealing method of the present invention.

SUMMARY

The present invention includes a sealing device and a sealing method for manufacturing a hermetically sealed OLED display. In one embodiment, the sealing method includes the following steps: (a) using a laser to direct a laser beam towards a frit which is located within an unsealed OLED display; (b) moving the laser (or the unsealed OLED display) such that the laser beam moves at a substantially constant speed on a sealing line along which there is the frit, electrode free regions, and electrode occupied regions that are located between two substrate plates; (c) modulating a power of the laser while the laser beam is moving at the substantially constant speed such that the laser beam imparts proper laser energy to the frit to cause the frit to melt and form a hermetic seal which connects the two substrate plates; (d) synchronizing the moving step and the modulating step such that the power of the laser can be controlled to change as needed at predetermined points along the sealing line depending on whether or not the laser beam is currently located over the electrodes that are present between the two substrate plates and depending on whether or not the laser beam is currently located over a curved portion of the sealing line on the two substrate plates; and (e) if the power of the laser is maximized or minimized at any point during the modulating step, then the speed that the laser beam is moved along the sealing line on the two substrate plates can be changed so that the laser beam is able to continue imparting proper laser energy to the frit so as to cause the frit to melt and form the hermetic seal which connects the two substrate plates.

BRIEF DESCRIPTION OF THE DRAWINGS

A more complete understanding of the present invention may be had by reference to the following detailed description when taken in conjunction with the accompanying drawings wherein.

DETAILED DESCRIPTION

Referring to FIGS. 1-5, there are several diagrams which are used to help explain how a sealing device 100 and a sealing method 200 can be used to hermetically seal an OLED display 102 in accordance with a first embodiment of the present invention. Although the sealing device 100 and the sealing method 200 are discussed below with respect to the manufacturing of a hermetically sealed OLED display 102, it should be understood that the same sealing device 100 and sealing method 200 can also be used in other applications which require the sealing of two glass plates. Accordingly, the sealing device 100 and the sealing method 200 of the present invention should not be construed in a limited, manner.

Figure 1A:
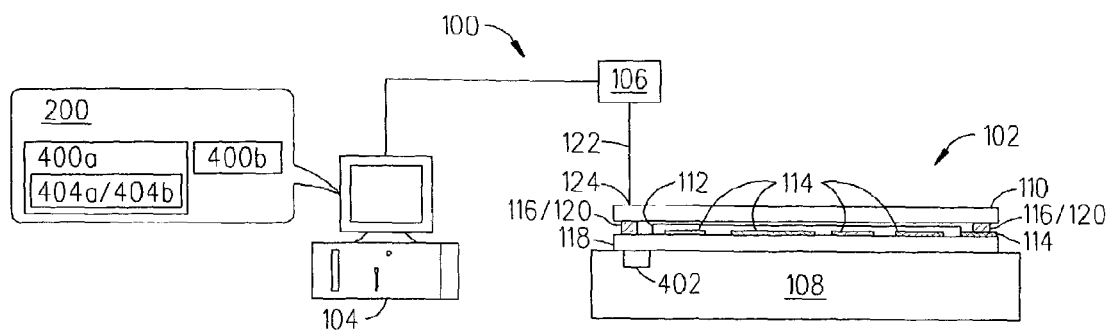
FIGS. 1A and 1B respectively show a cross-sectional side view and a top view that illustrate the basic components of a sealing device and a hermetically sealed OLED display in accordance with a first embodiment of the present invention.
Figure 1B:
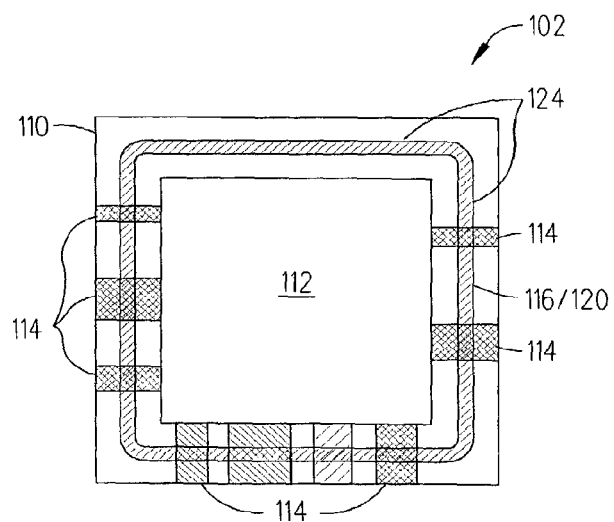

Referring to FIGS. 1A and 1B, there are respectively shown a cross-sectional side view and a top view that illustrate the basic components of the sealing device 100 and the hermetically sealed OLED display 102 in accordance with the present invention. As shown in FIG. 1A, the sealing device 100 includes a computer 104 (which processes instructions stored therein to implement the sealing method 200), a laser 106 (or other heat source 106), and a platform 108 (on which an unsealed OLED display 102 is placed). In one embodiment, the laser 106 can be a semiconductor laser with an un-polarized, multi-mode diode array source operating at a wavelength of 810 nm. The exemplary semiconductor laser 106 used in the experiments described herein was capable of delivering multiple power levels of up to ~60 watts in a spot size of ~0.3 mm diameter.

As shown in FIGS. 1A-1B, the OLED display 102 includes a multilayer sandwich of a cover plate 110 (e.g., first glass plate 110), a frit 116, one or more OLEDs 112/electrodes 114, and a substrate plate 118 (e.g., second glass plate 118). The OLED display 102 has a hermetic seal 120 (formed from the frit 116) which protects the OLEDs 112 located between the two plates 110 and 118. The hermetic seal 120 is typically located just inside the outer edges of the OLED display 102. And, the OLEDs 112 are located within a perimeter of the hermetic seal 120. As can be seen, the electrodes 114 which are connected the OLEDs 112 pass/extend through the hermetic seal 120 so they can be connected to an external device (not shown). It is the presence of these electrodes 114 (e.g., non-transparent metal electrodes 114) that can make it difficult to form the hermetic seal 120 between the two plates 110 and 118. This is because the electrodes 114 have different patterns and different optical/thermal properties such that some of the laser energy from the laser 106 is either absorbed or reflected by the electrodes 114 which creates an uneven temperature distribution in the frit 108 during the sealing process which can lead to a non-hermetic connection between the two plates 110 and 118. How this problem is solved by using the sealing device 100 and the sealing method 200 of the present invention is described below with respect to FIGS. 2-5.

Figure 2:
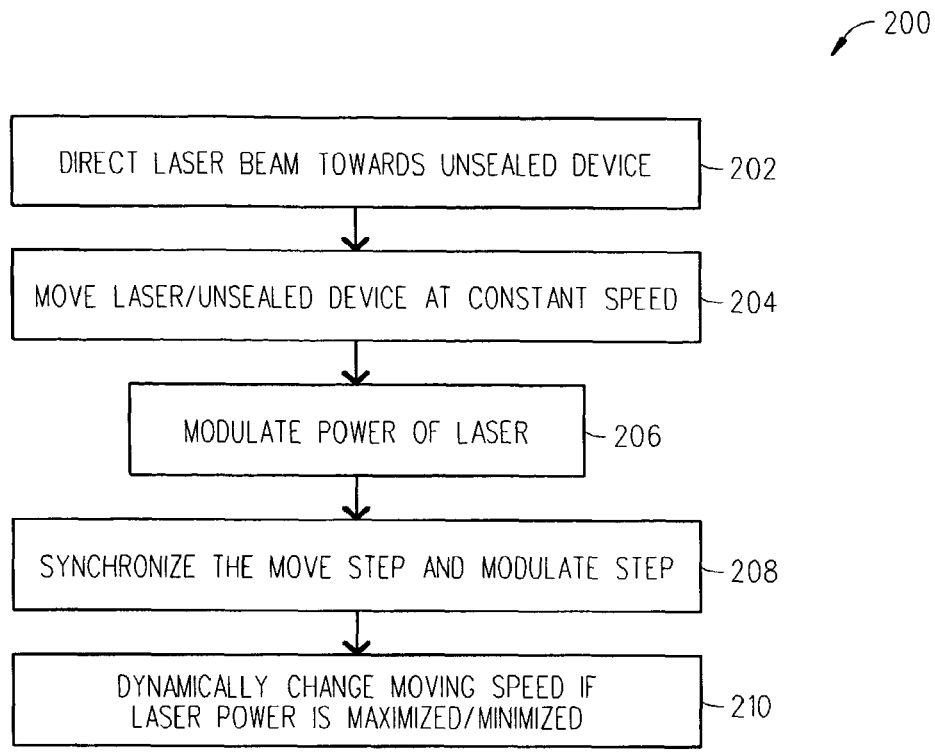
FIG. 2 is a flowchart illustrating the steps of a preferred sealing method for manufacturing the hermetically sealed OLED display shown in FIGS. 1A and 1B in accordance with the first embodiment of the present invention.

Referring to FIG. 2, there is a flowchart illustrating the steps of the preferred method 200 for manufacturing the hermetically sealed OLED display 102. Beginning at step 202, the sealing device 100 uses the laser 106 to direct a laser beam 122 towards the sealing line 124 on the unsealed OLED display 102 and in particular towards the frit 116 which is located between the two substrate plates 110 and 118. At step 204, the sealing device 100 moves the laser 106 (or the unsealed OLED display 102) such that the laser beam 122 moves at a substantially constant speed on the sealing line 124 along which there is the frit 116, regions free of electrodes 114, and regions occupied by electrodes 114 which are connected to the OLEDs 112 located between the two glass plates 110 and 118. At step 206, the sealing device 100 modulates the power of the laser 106 while the laser beam 122 is moved at the substantially constant speed along the sealing line 124 such that the laser beam 122 is able to impart sufficient laser energy (not too much or too little laser energy) to the frit 116 which causes the frit 116 to melt and form the hermetic seal 120 which connects the two glass plates 110 and 118. At step 208, the sealing device 100 synchronizes both the moving step 204 and the modulating step 206 so that the power of the laser 106 can be controlled to change in a linear or non-linear fashion as is needed at predetermined points along the sealing line 124 depending on whether or not the laser beam 122 is currently located over the electrodes 114 that are present between the two substrate plates 110 and 118 and depending on whether or not the laser beam 122 is currently located over a curved portion of the frit 116 (or sealing line 124) between the two substrate plates 110 and 118. At step 210, the sealing device 100 may have to dynamically change the speed which the laser beam 122 is moving along the sealing line 124 on the two substrates 110 and 118 if the laser 106 reaches its maximum or minimum power capacity at any point during the modulation step 206 so that the laser beam 122 can continue to impart sufficient laser energy (not too much or too little laser energy) to the frit 116 to cause the frit 116 to melt and form the hermetic seal 120 between the two substrate plates 110 and 118. A detailed discussion about these features and some additional features associated with the sealing method 200 are discussed next with respect to FIGS. 3-5.

Figure 3A:
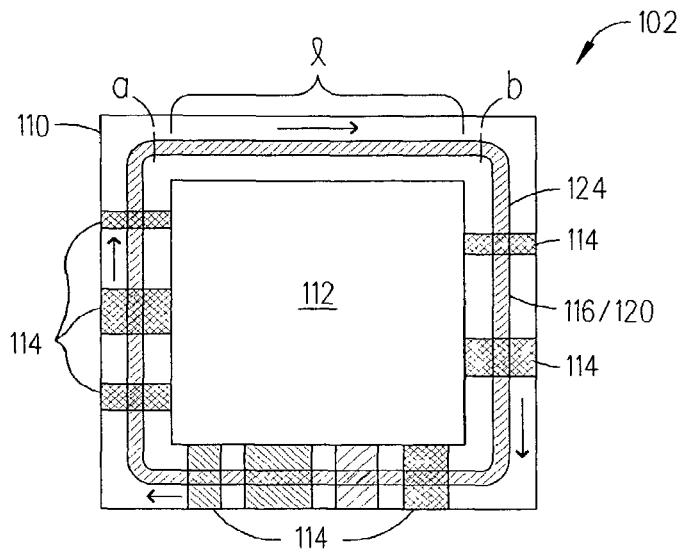
FIGS. 3A-3B are two diagrams which are used to help explain an additional feature that can be used to enhance the moving step associated with the sealing method shown in FIG. 2 in accordance with the first embodiment of the present invention.
Figure 3B:
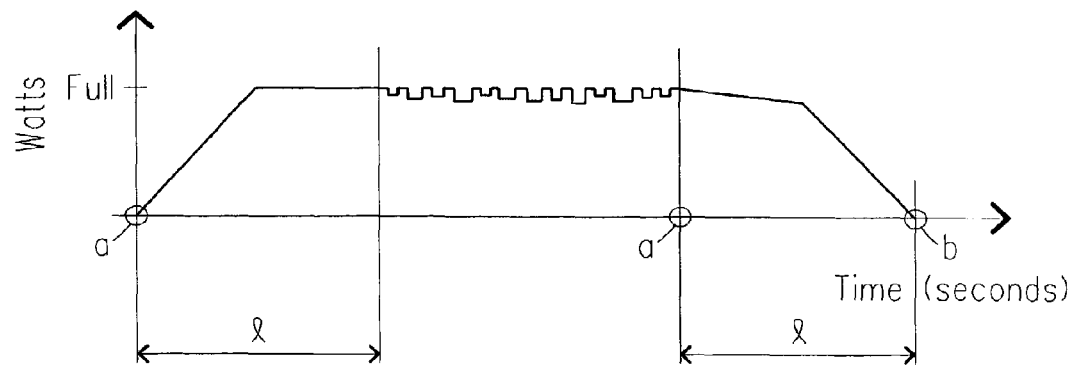

Referring to FIGS. 3A-3B, there are two diagrams which are used to help explain an additional feature that can be used to enhance the moving step 204 of the sealing method 200 in accordance with the present invention. The moving step 204 can be enhanced by implementing an overlapping scheme which helps prevent the creation of a start/stop defect that could adversely affect the formation of the hermetic seal 120 in the OLED display 102 (see also the experimental results discussed below with respect to FIGS. 5A-5E). To implement the overlapping scheme, the sealing device 100 would move the laser 106 in a clockwise fashion (or counter-clockwise fashion) such that the laser beam 122 is first directed at a start point "a" on the sealing line 124 of two substrate plates 110 and 118 and passed over the sealing line 124 around an entire perimeter of the two substrate plates 110 and 118 and then passed over the start point "a" and an overlapping portion "l" of the sealing line 124 again until it reaches a stop point "b". This overlapping scheme helps prevent the creation of start/stop defects in the hermetic seal 120 by ensuring that sufficient laser energy has been imparted to the frit 116 to cause the frit 116 to melt and form the hermetic seal 120 between the two substrate plates 110 and 118. The actual power output from the laser 106 on the overlapping portion "l" can be experimentally determined and would not normally exceed the maximum power of the laser 106 but if it did then the speed can be decreased as needed so the hermetic seal 120 can still be formed between the two substrate plates 110 and 118. An exemplary laser power profile using the sealing method 200 and the overlapping moving step 204 is discussed next with respect to FIG. 3B.

As shown in FIG. 3B, the laser 106 is first powered and the sealing starts on the start point "a". Then, the laser 106 has its power ramped-up to full power before the laser beam 122 reaches the end of the overlapping portion "l". After this point, the power level of the laser 106 would be modulated such that the laser beam 122 would have a lower power at or near the nine different electrodes 114 and at or near the four curves in the OLED display 102. Once, the laser beam 122 reaches the start point "a" again then the laser 106 would have its power ramped-down to no power while the laser beam 122 is moved for a second time over the overlapping portion "l" towards the stop point "b". As can be seen, the overlapping portion "l" is used to first ramp-up the power during the first pass and then it is used to ramp-down the power during the second pass of the laser beam 122. The distance of the overlapping portion "l" could be determined if the laser power level used was known and if the sealing speed used in the sealing process was also known. For instance, if the sealing speed is 20 mm/s and the laser power is reduced from 35 W (full power level) to 0 W at a slope of −50 W/s then this would result in a 14 mm long overlapping portion "l". Of course, it is not necessary for the whole overlapping portion "l" to be overlapped by the laser beam 122 nor is it necessary to ramp-up/ramp-down the laser power to/from full power while in the overlapping portion "l".

In the example shown in FIGS. 3A-3B, the sealing pattern used was a rounded rectangular pattern and the laser 106 was enabled/powered so the sealing started directly on the frit 116 at the 0° tangential point (in the x-direction). Alternatively, the laser 106 could have been enabled/powered so the sealing started directly on the frit 116 at the 90° tangential point (in the y-direction). As shown, the laser 106 is enabled/powered such that the sealing is started directly on the sealing line 124 (frit 116) which by itself is a substantial improvement over the traditional sealing techniques in which the laser 106 was enabled/powered and moved outside the sealing line 124 (frit 116) before the laser beam 122 would actually be directed towards the sealing line 124 (frit 116) on the two substrates 110 and 118. Another OLED display 102' is discussed next which can be sealed by utilizing the sealing method 200 and the overlapping moving step 204 in accordance with the present invention.

Figure 4A:
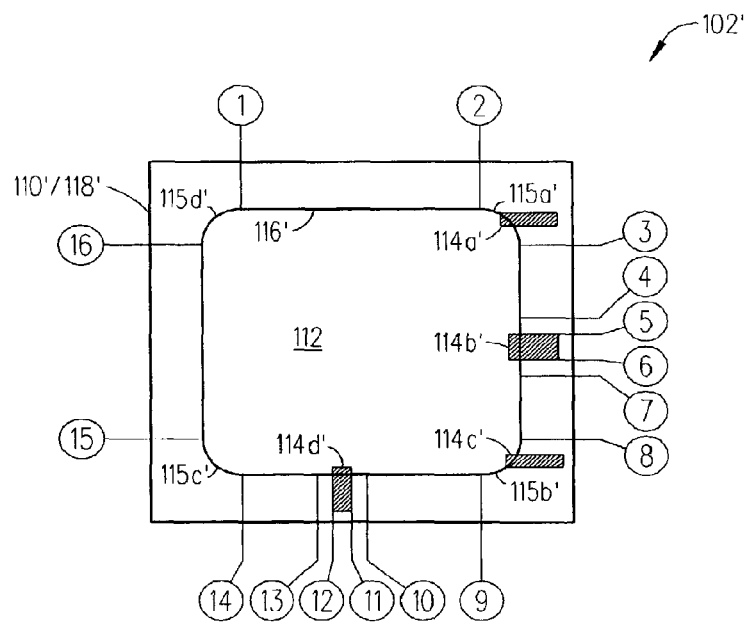
FIGS. 4A-4D there is shown an exemplary OLED display along with several different graphs which are used to help explain in more detail some of the different features associated with the sealing method shown in FIG. 2 in accordance with the first embodiment of the present invention.
Figure 4B:
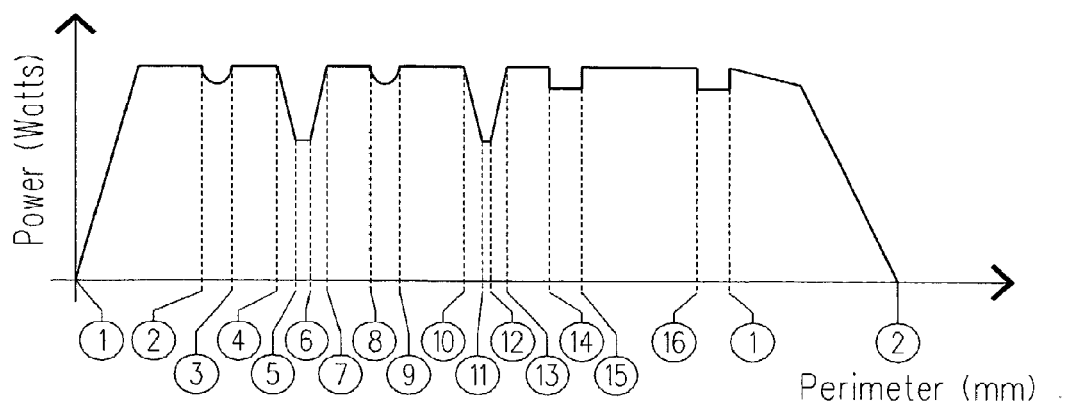

Referring to FIGS. 4A-4D, there is shown an exemplary OLED display 102' along with several different graphs which are used to help explain in more detail some of the different features associated with the sealing method 200 in accordance with the present invention. This exemplary OLED display 102' has four electrodes 114a', 114b', 114c' and 114d' and four corners 115a', 115b', 115c' and 115d' at which the power of the laser 106 is modulated in both a linear fashion and a non-linear fashion to ensure that sufficient laser energy is imparted to the frit 116' to cause the frit 116' to melt and form the hermetic seal 120' between the two substrate plates 110' and 118'. In particular, the different materials associated with the glass-frit-glass areas and the glass-frit-electrode-glass areas required that the perimeter be segmented into 16 parts which was then used to help form a power profile (see FIGS. 4A-4B). In FIG. 4B, the power profile was generated under the assumption that the sealing was to occur in a clockwise fashion. The laser power modulation can be achieved by using a direct analog control over the laser 106 where a control signal is sent to laser 106 from an analog output port in an input/output board within the computer 104 (see FIG. 1A).

To seal the OLED display 102', a relative motion has to be realized between the laser 106 and the sealing line 124' on the OLED display 102' (see steps 204, 206 and 208 in FIG. 2). This can be achieved by either moving the laser 106 or by moving the two substrate plates 110' and 118' but in either case the laser power control needs to be synchronized with the motion such that the laser power changes only where it is suppose to change at different points along the sealing line 124' on the OLED display 102'. There are several different methods that the sealing device 100 can use to synchronize the motion and the power control over the laser 106. For instance, the sealing device 100 can synchronize the motion and power control over the laser 106 by using an encoder/timing method 400a or a field-programmable gate array (FPGA) method 400b (see FIG. 1A).

Figure 4C:
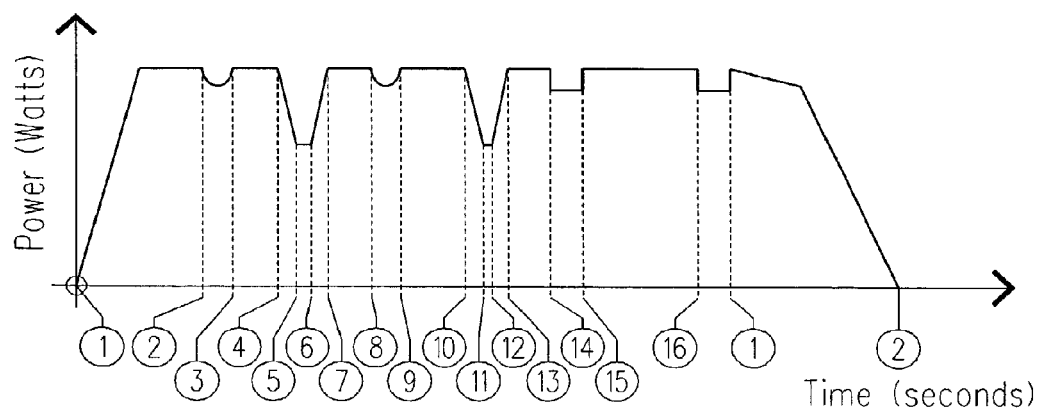
Figure 4D:
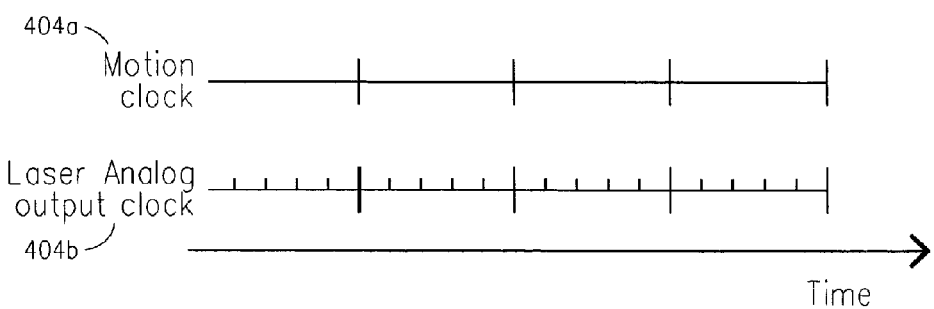

In the encoder/timing method 400a, the sealing device 100 includes a motion system encoder 402 (e.g., attached to platform 108 as shown in FIG. 1A) that functions at the laser start point "l" to send a pulse to the computer 104 to start a motion clock 404a used for motion control and to start a laser clock 404b used for laser power control (see FIGS. 4C-4D). Assuming, the clocks 404a and 404b have accurate clock rates, then the encoder/timing method 400a would be able to synchronize the motion of the laser 106/OLED device 102' with the modulation of the power of the laser 106. The encoder/timing method 400a also enables the laser power to be changed at a spatial resolution which is much higher than the motion resolution of the laser 106/OLED display 102' (see FIG. 4D). The finer spatial resolution enables the laser power to be changed much faster than the motion control by interpolating multiple power changing points during each stage move from one point to another point (e.g., five laser power changes can be made during one motion change in FIG. 4D).

The spatial resolution-motion resolution relationship can also be represented in the following equation: Clock duration of laser analog control=(Motion update duration)×(required spatial resolution of laser power control)/(Motion resolution) where the rate of laser analog control would normally be rounded to the nearest integer. For instance, assume the OLED display 102' is sealed at a rate of 20 mm/s and that the motion update rate (from one point to another one) is 10 ms. Then, the motion resolution=sealing speed (20 mm/s)*motion update rate (10 ms)=0.2 mm=200 um. And, if the spatial resolution of laser power control is 10 um, then the laser analog control clock duration=10 ms*10 um/200 um=0.5 ms. Thus, the laser control rate=1/0.5 ms=2 KHz. Of course, it should be appreciated that the spatial resolution of the laser power modulation control could also be independent of the sealing speed.

The encoder/timing method 400a can provide a great deal of flexibility when sealing different types of OLED displays (which have different electrode layouts/configurations). For instance, the encoder signal of motion start is used to synchronize the start of the laser power control and the motion control. And, then during the sealing, the control of the motion and the power of the laser 106 follow individual predetermined motion and power control profiles (where the power control profile can be determined experimentally). However, if there is a product line which continually uses the same frit layout in the OLED display, then the FPGA method 400b may be a desirable way for synchronizing the motion and the analog power control over the laser 106. The FPGA method 400b involves the use of specially configured input/output (I/O) hardware. Basically, the specially configured I/O hardware is built specifically for sealing one type of OLED display 102. With this specially configured hardware, it may be desirable to have the ability to monitor two encoder signals (associated with the x-axis and the y-axis) to determine that a fixed spatial interval has been traversed (on either an individual axis or between two axes, or multiple axes i.e., that a incremental vector length has been traversed) so as to be able to synchronize the laser output power. In this way, the laser 106 may be synchronized with absolute position and/or velocity and various advanced control schemes may be pursued to implement the sealing method 200. The FPGA method 400b is desirable due to its speed where the "algorithms" are actually implemented in "hardware" as opposed to software and as such the "algorithms" can be executed in a single clock cycle (e.g., 80 MHz).

Alternatively, there is a laser/robot motion control system currently available which has an analog power update rate that is equal to the motion update rate. As such, the use of this type of laser/robot motion control system in the present invention would mean that there would be no need for the external synchronization of the laser power control with the motion control since the motion and analog power updates would be bundled. However, because the motion update rate is usually at the ms level, then the laser spatial resolution would be considered relatively low especially when sealing at a relatively fast speed. For example, if the sealing speed is at 100 mm/s and the motion and analog power control where updated together at 1 ms level, then the laser spatial resolution could not exceed the motion spatial resolution. This may not be desirable.

Figures 5A, 5B:
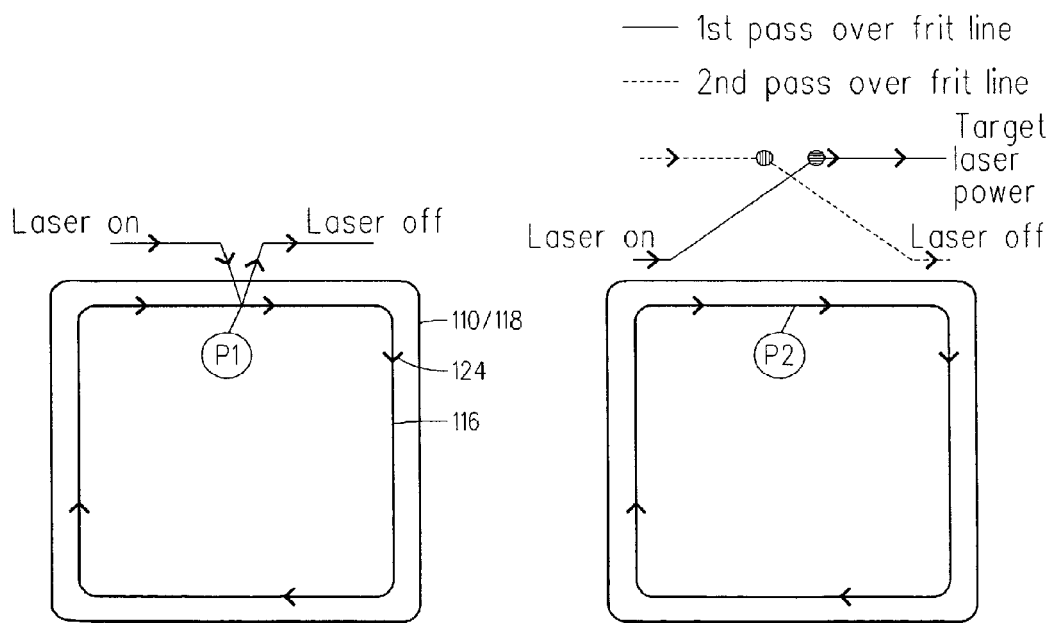
FIGS. 5A-5E there are illustrated six drawings/graphs that are associated with a couple of experiments (and their results) which were conducted to test how well the sealing method shown in FIG. 2 functions to hermetically seal two glass substrates (which did not contain OLEDs and electrodes) in accordance with the first embodiment of the present invention.

Referring to FIGS. 5A-5E, there are illustrated six drawings/graphs which are associated with (several experiments (and their results) that were conducted to test how well the sealing method 200 (including the overlapping moving step 204 and the encoder/timing method 400a) hermetically seals two glass substrates (without the OLEDs 112 and electrodes 114). FIG. 5A (PRIOR ART) is a diagram illustrating the traditional laser start/stop process with a fixed laser power that was used to seal two glass substrates. The resulting sealed glass packages underwent a stress analysis test utilizing a polarimeter which indicated a high localized stress at the point "p1" where the laser started/stopped. Plus, a mechanical anticlastic bending analysis test demonstrated that the "traditional" laser start/stop location "p1" was the predominant source for failure. In thirty-nine different tests, 95% of the failures originated at the laser start/stop point "p1" and 5% of the failures originated at the dispense start/stop of the frit 116.

In contrast, FIG. 5B is a diagram illustrating the new variable laser power start/stop process with a modulated laser power (see also FIG. 2). Basically, the variable laser power can distribute residual stress over a broad area rather than have the stress occur at a point source "p2". To accomplish this, the laser power is slowly ramped-up and then ramped-down to form a laser start/stop point "p2", rather than abruptly entering and exiting the same frit location with full sealing power as was done at point "p1" in the traditional laser start/stop process (see FIG. 5A). The glass plates which were sealed by the variable power laser start/stop process had a ~25% improvement in mechanical integrity when compared to the glass plates sealed by the traditional laser start/stop process. In particular, the polarimetry stress analysis tests indicated considerably lower stress levels at or near the laser start/stop "p2" when compared to the "traditional" laser start/stop "p1". And, the anticlastic bending mechanical analysis tests demonstrated that the laser start/stop "p2" was no longer the predominant source for failure. In thirty-nine different tests, 93% of the failures originated from the frit dispense start/stop point and 7% of the other failures originated from other locations along the sealing line 124 (not the laser start/stop point "p2").

Figure 5C:
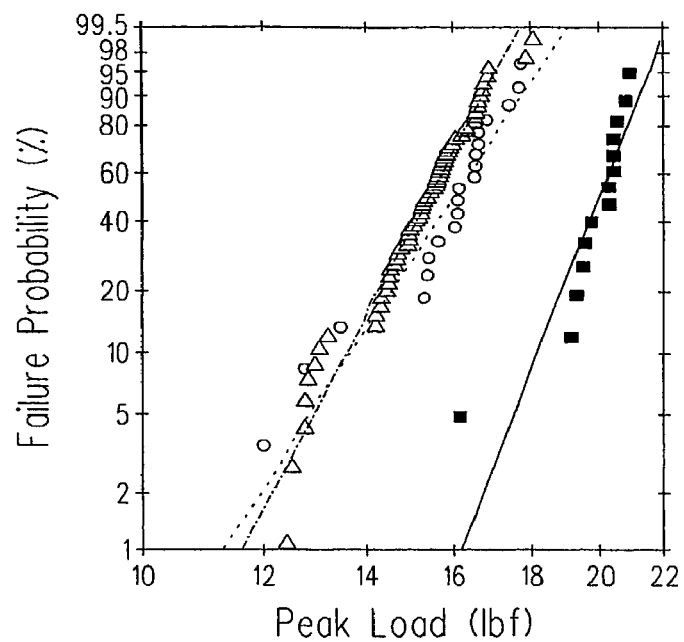

Moreover, an additional experiment was conducted that indicated where the variable laser power start/stop process increased the peak load capabilities of the sealed glass substrates (see FIG. 5C). In FIG. 5C, the ■ represents tested samples (Corning Inc. glass sold under name EAGLE®) which had one frit pattern using the full power variable laser power start/stop process (where mean=19.8, std.dev.=1.19), the represents tested samples which had one frit pattern using the traditional laser power start/stop process (where mean=15.9, std.dev.=1.53) and the Δ represents tested scored samples which had multiple frit patterns using the traditional laser power start/stop process (where mean=15.3, std.dev.=1.27). These experimental results demonstrate that the variable power laser start/stop process is also a good way to increase the mechanical integrity of a sealed glass package (e.g., OLED display).

Figure 5D:
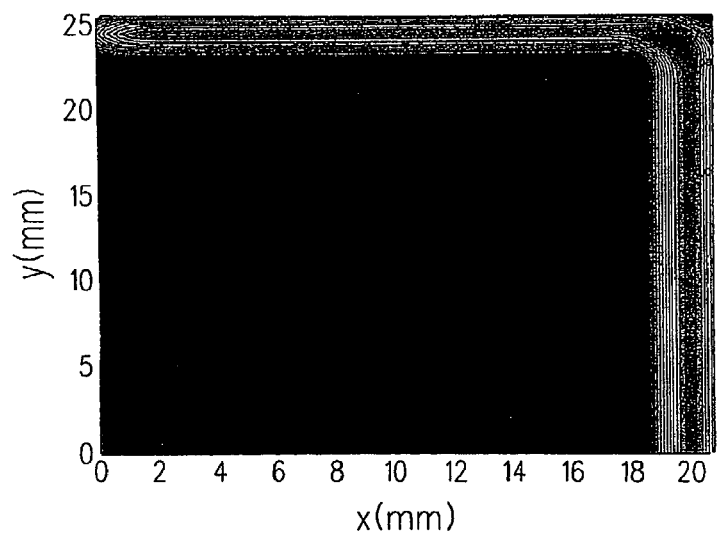
Figure 5E:
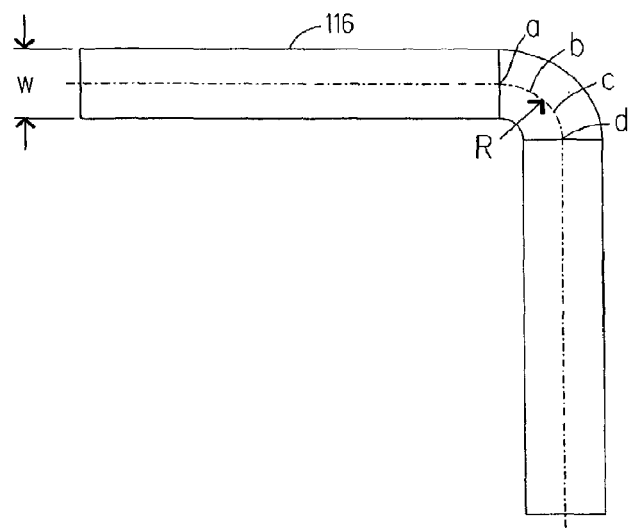

Furthermore, another experiment was conducted which showed that the sealing method 200 should reduce the laser power at corners to reduce the potential for thermal damage to OLEDs 112 that are located near the corners of the two substrates 110 and 118. FIG. 5D is a photo which illustrates that the sealing temperatures around a corner can be ~200° C. higher than the sealing temperature along the linear edges when the laser power and the laser speed are not varied. Thus, these results recommend that the sealing method 200 should reduce the laser power (e.g., ~3-5 W for 38 W sealing power) when sealing at the corners of the two substrates 110 and 118. For instance, FIG. 5E illustrates the segments a, b, c and d of a corner at which the laser power should be reduced (if desired the laser power could be increased back to the original level at some distance after point "d"). In operation, the computer 104 and software allows the laser power level to be specified at a number of positions along the radius of the curve such as at "a" and "b" by linearly interpolating the power level between "a" and "d". If desired, the amount that the laser power could be reduced around the corner can be calculated by using some sort of equation like 1-w/2R that would also enable one to keep the same laser residence time at the corner (in this experiment w=1 mm and R=1.5 mm). An advantage of reducing the power level at the corners is that this should help increase the mechanical strength of the hermetic seal 120 and also prevent thermal damage of the OLEDs 112.

Lastly, an experiment was conducted that demonstrated where temperatures over the frit 116/electrode 114 areas are typically higher than the temperatures over the frit 116/non-electrode areas when applying a constant laser power. Since, electrodes 114 are usually good thermal conductors, OLEDs 112 near the electrodes 114 can be thermally affected. Thus, if the laser power is reduced quickly over the electrodes 114 and resumed higher over the non-electrode areas, then the temperatures along the sealing line 124 and hence nearby to the OLEDs 112 can be controlled.

Figure 6:
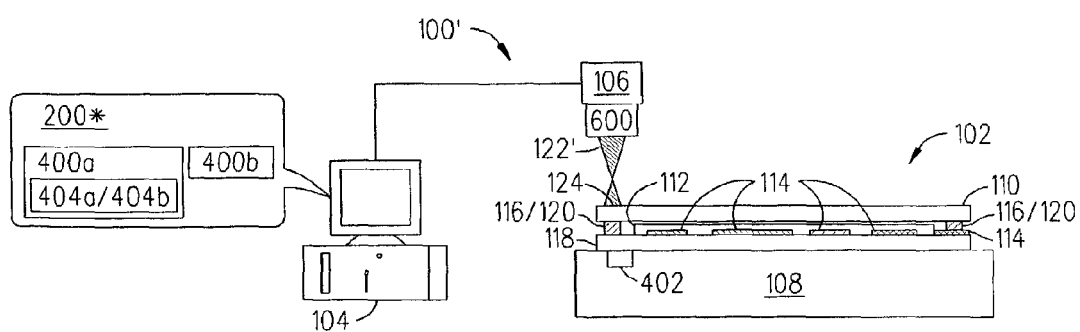
FIG. 6 is a cross-sectional side view that illustrates the basic components of a sealing device which can be used to hermetically seal an OLED display in accordance with a second embodiment of the present invention.

Referring to FIG. 6, there is a cross-sectional side view that illustrates the basic components of a sealing device 100' which can be used to hermetically seal an OLED display 102 in accordance with a second embodiment of the present invention. In this embodiment, the sealing device 100' has the same components as the aforementioned sealing device 100 except that the new sealing device 100' has a laser 106 with a laser focusing unit 600 attached thereto which is used to change the shape and density of the laser beam 122'. For instance, the laser focusing unit 600 can have an aperture that is controlled to change the shape and density of the laser beam 122' by focusing or de-focusing the laser beam 122' at the frit 116 (a de-focused laser beam 122' is shown in FIG. 6). The sealing device 100' also implements the sealing method 200 described above but in this embodiment instead of performing step 210 (dynamically changing the speed that the laser beam 122 moves along the sealing line 124 when the laser, 106 reaches its maximum or minimum power capacity) the laser focusing unit 600 would dynamically adjust the shape and power density of the laser beam 122' so that the laser beam 122' continues to impart sufficient laser energy (not too much or too little laser energy) to the frit 116 to cause the frit 116 to melt and form the hermetic seal 120 which connects the two substrate plates 110 and 118.

From the foregoing, it should be appreciated by those skilled in the art that the present invention relates to a sealing method 200 where the sealing device 100 and 100' synchronizes the laser power and the substantially constant motion of the laser/OLED display 102 so as to change the laser power timely and precisely at predetermined locations on the OLED display 102 and 102'. This variable power sealing method 200 has several other features including (for example): (1) ramping up/down and overlapping the laser power over the start/stop area to reduce residual stress at the laser start/stop area; (2) reducing the laser power at corners to reduce the chance for thermal damage to the OLEDs 112 which are located near the corners; and (3) reducing the laser power over electrodes 114 themselves to reduce the chance for thermal damage to the electrodes 114 and to reduce the chance for a problematical heat transfer from the electrodes 114 to the OLEDs 112. In addition, the variable power sealing method 200 has many other advantages and features some of which are as follows:

The laser power modulation scheme can be used to control laser power for sealing applications which involve materials other than glass-frit-glass and glass-frit-electrode-glass.

The laser analog power control is sufficiently fast therefore the laser power modulation possesses a good spatial resolution. For instance, some lasers 106 can be used that have a power change delay which is less than 100 micron seconds this means it is possible to have a spatial resolution better than 0.5 micron when the sealing speed is 5 mm/s.

The laser power modulation scheme requires the synchronization between the laser power and the position of the OLED display so that one can change a laser power level precisely at target 2D sealing positions. For OLED sealing, a power profile can be experimentally obtained before performing the actual sealing operation in a manufacturing environment. The sealing system 100 and 100' would follow the power control profile and if desired could also use a feedback mechanism (e.g., temperature feedback mechanism) to help meet different laser power requirements over the glass-frit-glass areas and glass-frit-electrode-glass areas. The power control profile (without the feedback mechanism) can be used to implement an open-loop sealing method 200 which generally results in repeatable and robust sealing results.

The laser power modulation scheme is a better sealing solution than a method that uses a mask because it can be very difficult to properly place/align a mask over the electrodes 114 within the OLED display 102 and 102'.

The laser power modulation scheme is a better sealing solution than a method that uses a variable speed because a mechanical system can not change speeds instantaneously. For instance, the variable speed method can require a long transition time, which can result in unwanted transition areas. However, the variable speed method is still used in the present invention whenever the laser 106 reaches its maximum output power limit or its minimum output power limit (see step 210 in FIG. 2).

The laser power modulation scheme can also speed-up the OLED frit sealing process to meet a fast "tactical time" completion requirement (which is commonly in the 4-minute range regardless of the size of the OLED displays 102 and 102'). In addition, the laser power modulation scheme facilitates a standby mode which occurs when the laser 106 moves from one frit pattern (in one OLED display) to another frit pattern (in another OLED display). Plus, the laser power modulation scheme features minimal delay in the time when laser 106 is switched back to the ON mode from the standby mode, which keeps the laser 106 from experiencing a thermal shock as well as helps reduce the pattern indexing time for large substrate OLED frit sealing.

The sealing method 200 can be used to seal two glass sheets together without the aid of a frit. In this case, one of the glass sheets may be doped with the same material used to dope the frit such that the doped glass sheet can now absorb the heat from the laser 106.

The glass plates 102 and 110 which can be sealed to one another can be Code 1737 glass plates and EAGLE 2000™ glass plates which are manufactured by Corning Inc. Or, the glass plates 102 and 110 could be made by companies such as Asahi Glass Company (e.g., OA10 glass and OA21 glass), Nippon Electric Glass Company, NHTechno and Samsung Corning Precision Glass Company (for example). In the OLED application, it is highly desirable that the two substrate plates 110 and 118 have the same or similar CTE, coefficient of thermal expansion.

The electrodes 114 can be non-transparent, reflective, absorptive, transmissive or any combination thereof.

The frit 116 can be a low temperature glass frit that contains one or more absorbing ions chosen from the group including iron, copper, vanadium, and neodymium (for example). The frit 116 may also be doped with a filler (e.g., inversion filler, additive filler) which lowers the coefficient of thermal expansion of the frit 116 so that it matches or substantially matches the coefficient of thermal expansions of the two glass plates 110 and 118. For a more detailed description about the compositions of some exemplary frits 116 that could be used in this application reference is made to U.S. patent application Ser. Nos. 10/823,331 and 10/414,653 (the contents of these documents are incorporated by reference herein).

Although two embodiments of the present invention have been illustrated in the accompanying Drawings and described in the foregoing Detailed Description, it should be understood that the invention is not limited to the disclosed embodiments, but is capable of numerous rearrangements, modifications and substitutions without departing from the spirit of the invention as set forth and defined by the following claims.

The invention claimed is:

1. A method for manufacturing a glass package, said method comprising the steps of:
   using a heat source to direct a beam towards a frit which along with at least one light emitting device is located between two substrate plates;
   moving the heat source or the two substrate plates such that the beam moves at a substantially constant speed on a sealing line of said two substrate plates, where said sealing line includes said frit, a plurality of regions free of electrodes, and a plurality of regions occupied by electrodes all of which are located between said two substrate plates;
   modulating a power of the heat source when moving the beam at the substantially constant speed such that the beam imparts sufficient heat source energy to said frit to cause said frit to form a hermetic seal which connects said two substrate plates, and
   changing the speed that the beam moves along the sealing line on said two substrate plates in response to the power to the heat source reaching a maximum or a minimum power capacity, wherein the beam continues to impart sufficient heat source energy to said frit to cause said frit to form the hermetic seal which connects said two substrate plates
   further comprising the step of synchronizing both the moving step and the modulating step so that the power of the heat source can be controlled to change in a linear or non-linear fashion as is needed at predetermined points along the sealing line depending on whether or not the beam is currently located over the electrodes between said two substrate plates and depending on whether or not the beam is currently located over a curved portion of the sealing line on said two substrate plates.

2. The method of claim 1, wherein said synchronizing step further includes a step of utilizing a motion encoder system which enables the power of the heat source to be changed with a spatial resolution that is higher than a motion resolution wherein a plurality of power control changes can be implemented while the beam is making a single point-to-point move along the sealing line on said two substrate plates.

3. The method of claim 1, wherein said synchronizing step further includes utilizing a field-programmable gate array (FPGA) system which enables the power of the heat source to be changed with a spatial resolution that is higher than a motion resolution wherein a plurality of power control changes can be implemented while the beam is making a single point-to-point move along the sealing line on said two substrate plates.

4. A device for sealing a glass package, said device comprising:
   a platform on which there is placed an unsealed glass package which is made-up of a frit and at least one light emitting device that are located between two substrate plates; a computer; and a heat source, wherein said computer processes instructions stored therein to facilitate the following:
   directing the heat source to emit a beam towards said frit;
   moving the heat source or the two substrate plates such that the beam moves at a substantially constant speed on a sealing line of said two substrate plates, where said sealing line includes said frit, a plurality of regions free of electrodes, and a plurality of regions occupied by electrodes all of which are located between said two substrate plates;
   modulating a power of the heat source when moving the beam at the substantially constant speed such that the beam imparts sufficient heat source energy to said frit to cause said frit to form a hermetic seal which connects said two substrate plates then changing the speed that the beam moves along the sealing line on said two substrate plates in response to the power to the heat source reaching a maximum or a minimum power capacity so that the beam continues to impart sufficient heat source energy to said frit to cause said frit to form the hermetic seal which connects said two substrate plates,
   wherein said computer facilitates synchronizing the moving operation and the modulating operation so that the power of the heat source can be controlled to change in a linear or non-linear fashion as is needed at predetermined points along the sealing line depending on whether or not the beam is currently located over the electrodes between said two substrate plates and depending on whether or not the beam is currently located over a curved portion of the sealing line on said two substrate plates.

5. The device of claim 4, wherein said computer facilitates the synchronizing operation by interfacing with a motion encoder system which enables said computer to change the power of the heat source with a spatial resolution that is higher than a motion resolution wherein a plurality of power control changes can be implemented when the beam is making a single point-to-point move along the sealing line of said two substrate plates.

6. The device of claim 4, wherein said computer facilitates the synchronizing operation by interfacing with a field-programmable gate array (FPGA) system which enables said computer to change the power of the heat source with a spatial resolution that is higher than a motion resolution wherein a plurality of power control changes can be implemented while the beam is making a single point-to-point move along the sealing line on said two substrate plates.

7. A method for manufacturing a glass package, said method comprising the steps of:
   using a heat source to direct a beam through a light focusing unit and towards a frit which along with at least one light emitting device is located between two substrate plates;
   moving the heat source or the two substrate plates such that the beam moves at a substantially constant speed on a sealing line of said two substrate plates, where said sealing line includes said frit, a plurality of regions free of electrodes, and a plurality of regions occupied by electrodes all of which are located between said two substrate plates;
   modulating a power of the heat source when moving the beam at a substantially constant speed such that the beam imparts sufficient heat source energy to said frit to cause said frit to form a hermetic seal which connects said two substrate plates, wherein the light focusing unit provides the beam with a power density; and
   controlling the light focusing unit at the output of the heat source to adjust the power density of the beam in response to the power to the heat source reaching a maximum or a minimum power capacity, wherein the beam continues to impart sufficient heat source energy to said frit to cause said frit to form the hermetic seal which connects said two substrate plates.

8. The method of claim 7, further comprising the step of synchronizing both the moving step and the modulating step so that the power of the heat source can be controlled to change in a linear or non-linear fashion as is needed at predetermined points along the sealing line depending on whether or not the beam is currently located over the electrodes between said two substrate plates and depending on whether or not the beam is currently located over a curved portion of the sealing line on said two substrate plates.

9. The method of claim 8, wherein said synchronizing step further includes a step of utilizing a motion encoder system which enables the power of the heat source to be changed with a spatial resolution that is higher than a motion resolution wherein a plurality of power control changes can be implemented while the beam is making a single point-to-point move along the sealing line on said two substrate plates.

10. The method of claim 8, wherein said synchronizing step further includes utilizing a field-programmable gate array (FPGA) system which enables the power of the heat source to be changed with a spatial resolution that is higher than a motion resolution wherein a plurality of power control changes can be implemented while the beam is making a single point-to-point move along the sealing line on said two substrate plates.

11. The method of claim 7, wherein said moving step further includes an overlapping moving step where the movement of the beam begins at a start point on the sealing line of said two substrate plates and then passes over the sealing line around a perimeter of said two substrate plates and then passes over the start point on the sealing line and over a certain portion of the sealing line again so as to ensure sufficient heat source energy has been imparted to said frit to cause said frit to form the hermetic seal which connects said two substrate plates.

12. The method of claim 7, wherein said modulating step further includes utilizing a predetermined power profile to control the changing of the power of the heat source while the beam is moved along the sealing line so as to impart sufficient heat source energy to said frit to cause said frit to form the hermetic seal which connects said two substrate plates.

13. The method of claim 7, wherein said power modulating step further includes utilizing a feedback mechanism to control the changing of the power of the heat source while the beam is moved along the sealing line so as to impart sufficient heat source energy to said frit to cause said frit to form the hermetic seal which connects said two substrate plates.

\* \* \* \* \*